United States Patent [19]
Padawer

[11] Patent Number: 4,810,959
[45] Date of Patent: Mar. 7, 1989

[54] METHOD OF IMPROVING SIGNAL-TO-NOISE RATIO OF DETECTED RANDOM PULSES

[75] Inventor: Gerald M. Padawer, East Hills, N.Y.

[73] Assignee: Grumman Aerospace Corporation, Bethpage, N.Y.

[21] Appl. No.: 155,794

[22] Filed: Feb. 16, 1988

[51] Int. Cl.$^4$ ............................................. G01R 23/16
[52] U.S. Cl. ................................ 324/77 R; 324/78 R; 328/165
[58] Field of Search ................ 324/77 R, 77 A, 78 R, 324/78 D, 79 R, 79 D, 83 D, 303; 250/262; 364/484, 485; 377/19, 20; 328/165

[56] References Cited

U.S. PATENT DOCUMENTS

| | | | |
|---|---|---|---|
| 2,269,011 | 1/1942 | Dallos | 178/44 |
| 2,446,244 | 8/1948 | Richmond | 343/13 |
| 2,502,454 | 4/1950 | Grieg | 343/13 |
| 2,538,040 | 1/1951 | Prichard | 250/20 |
| 3,344,277 | 9/1967 | Smith et al. | 250/83.6 |
| 3,387,222 | 6/1968 | Hellwarth et al. | 329/192 |
| 3,432,761 | 3/1969 | Morine | 328/165 |
| 3,462,691 | 8/1969 | McDonald | 325/475 |
| 3,478,268 | 11/1969 | Coviello | 325/65 |
| 3,605,029 | 9/1971 | Freedman | 328/167 |
| 3,617,998 | 11/1971 | Freedman | 340/5 R |
| 3,621,389 | 11/1971 | Murray | 324/77 R |
| 3,626,168 | 12/1971 | Norsworthy | 324/77 R |
| 3,675,485 | 7/1972 | Loeb | 324/77 R |
| 3,775,770 | 11/1973 | Dillard et al. | 343/100 CL |
| 4,059,762 | 11/1977 | Horrocks | 250/336 |
| 4,078,178 | 3/1978 | Lowes | 250/336 |
| 4,223,218 | 9/1980 | Jacobson | 250/262 |
| 4,665,486 | 5/1987 | Schultz | 324/77 R |

*Primary Examiner*—Michael J. Tokar
*Attorney, Agent, or Firm*—Pollock, Vande Sande & Priddy

[57] ABSTRACT

The invention detects pulses, and, in response thereto, generates ramp functions with amplitudes corresponding to the interarrival times between successive pulses. These amplitudes are measured, and the occurrence of identical amplitudes are accoumulated in corresponding memory locations, each of which has an address corresponding to a particular interarrival time. The resultant memory contents define a population distribution of interarrival times which is an exponential decay function of interarrival time. Interarrival times exceeding a preselected value are disregarded.

5 Claims, 3 Drawing Sheets

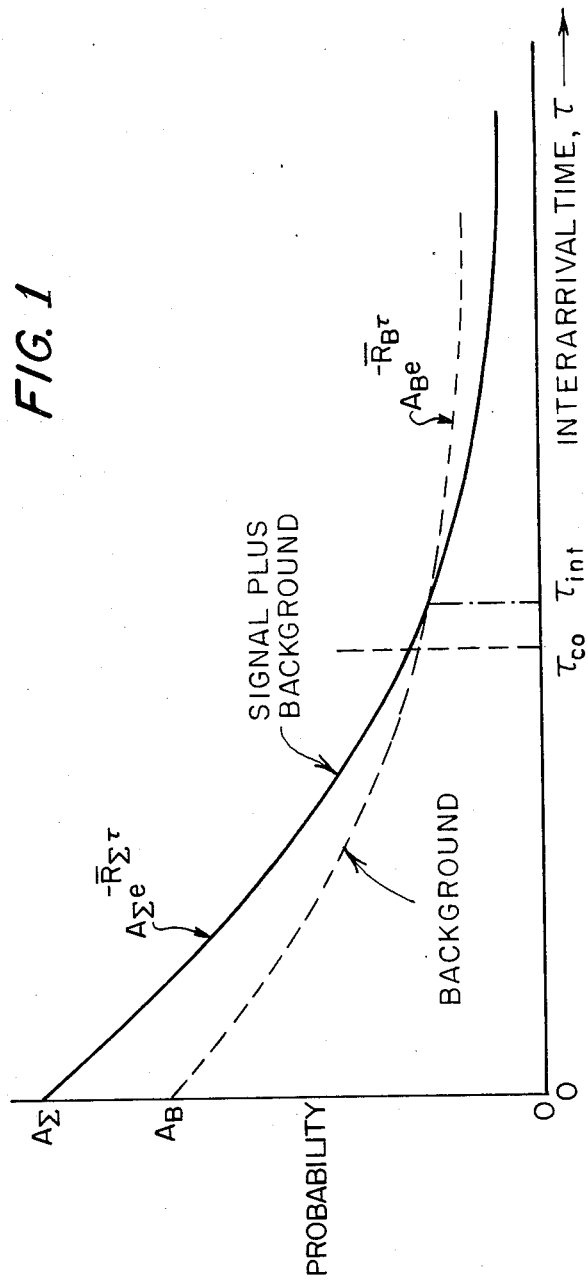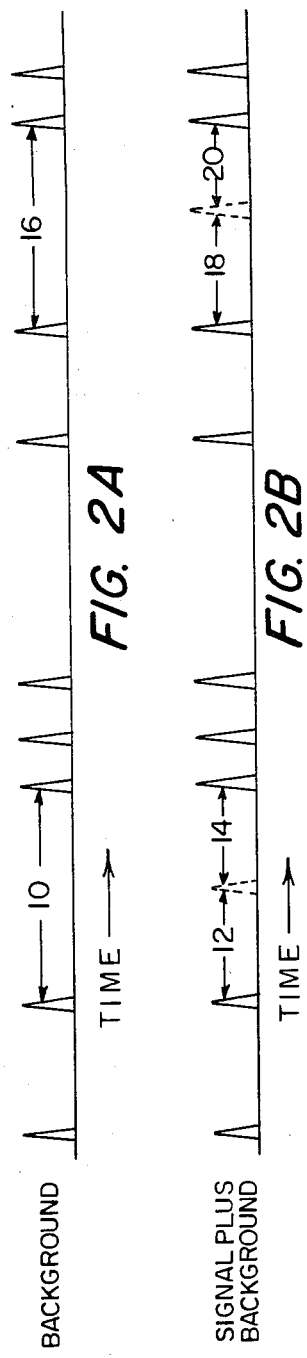

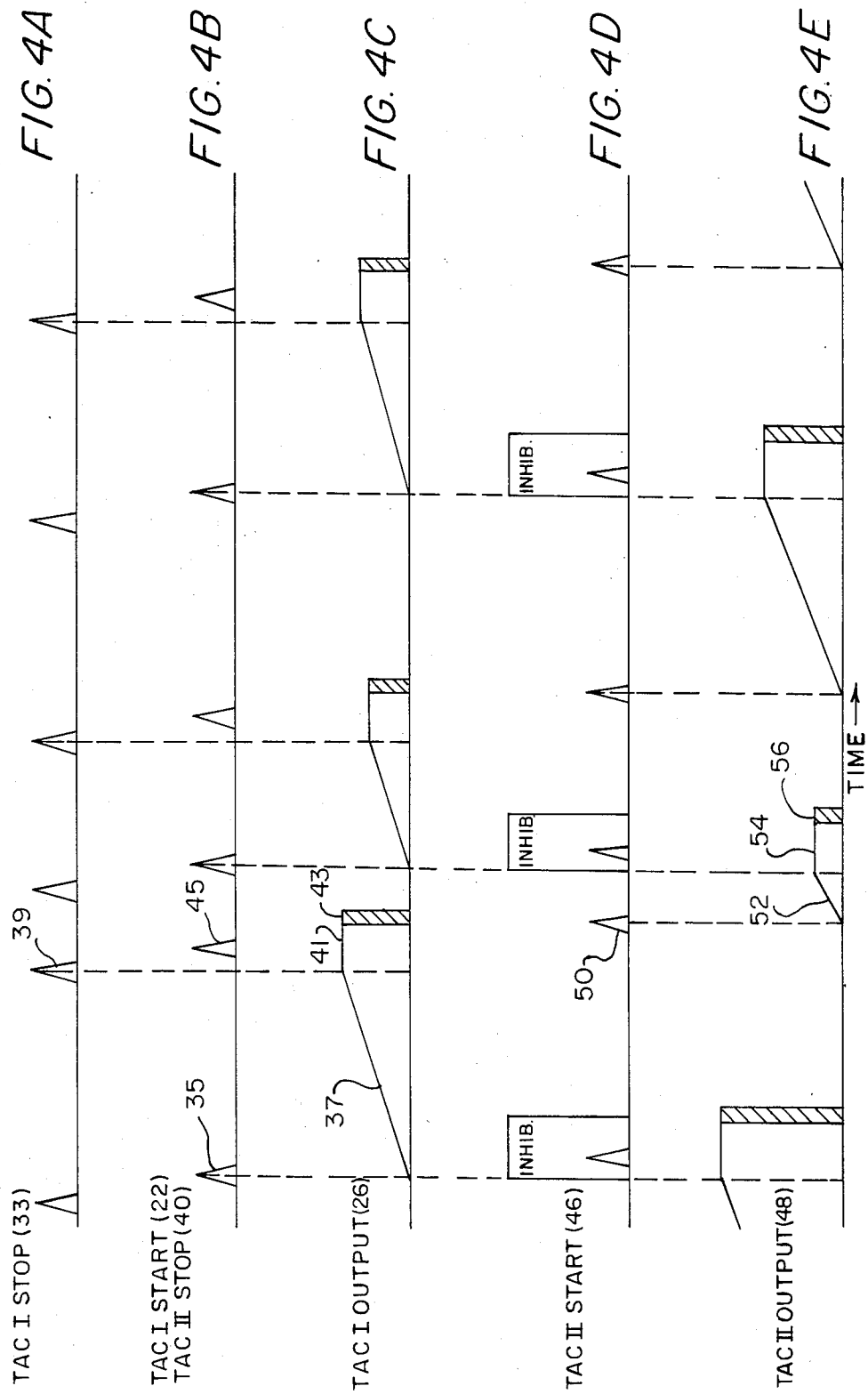

METHOD OF IMPROVING SIGNAL-TO-NOISE RATIO OF DETECTED RANDOM PULSES

FIELD OF THE INVENTION

The present invention improves the signal-to-background ratio of detected low-intensity random-pulse signals by ignoring pulse interarrival times exceeding a predetermined cut-off value.

BRIEF DESCRIPTION OF THE PRIOR ART

In a wide variety of applications it is necessary to detect low-intensity random pulses such as are encountered in nuclear physics, optics, and X-ray measurements. By increasing the signal-to-background ratio (S/B), one either achieves speedier acquisition of data, or improves the accuracy of measurement.

In the prior art, detected events, irrespective of their interarrival times, are tallied. (Interarrival time is defined as the time interval between immediately successive detected events.) Conventional current methods, albeit simple, by not imposing data-quality decisions based on interarrival-time criteria, fail to maximize the net signal, and thereby invoke measurement penalties. These penalties might include inordinately long observation periods as well as unduly large detectors that consume precious additional space and power, and contribute more weight than might be tolerated.

BRIEF DESCRIPTION OF THE PRESENT INVENTION

The present invention disregards the prior-art approach, and recognizes and takes advantage of the exponential decay character of the true probability distribution for interarrival times. More particularly the present invention utilizes the exponential property to advantage by ignoring such interarrival times for which background contributions exceed signal-plus-background contributions. In effect, the present invention decreases observation duration per sample, thus permitting the interrogating of more subjects in a given observation time interval. Further, the size, weight and cost of a requisite detector may be diminished as a result of such S/B pulse-processing improvements as are offered by the present invention. The end result will be the enhancement of detection sensitivity, i.e., the reduction of the detectability threshold for signals, and the minimization of statistical error, i.e., the improvement of measurement accuracy. These advantages of the present invention have wide areas of applicability. For example, in optical-radiation sensing the present invention is applicable for the detection of low fluxes of light, i.e., of weak sources of visible, ultraviolet, and X-ray photons. Further, there is significant applicability to nuclear radiation sensing for the detection of weak fluxes of sub-atomic particles and quanta, e.g., gamma rays, electrons, neutrons, and fast ions.

The above-mentioned objects and advantages of the present invention will be more clearly understood when considered in conjunction with the accompanying drawings, in which:

BRIEF DESCRIPTION OF THE FIGURES

FIG. 1 illustrates two exponential curves depicting the dependence of the differential probability of interarrival time with respect to interarrival time;

FIGS. 2A and 2B respectively illustrate timing diagrams of interarrival times for background data pulses and for signal-plus-background data pulses;

FIGS. 4A, 4B, 4C, 4D and 4E are a series of timing diagrams for signals appearing at various points in the system of FIG. 3.

DETAILED DESCRIPTION OF THE INVENTION

Figure 3:
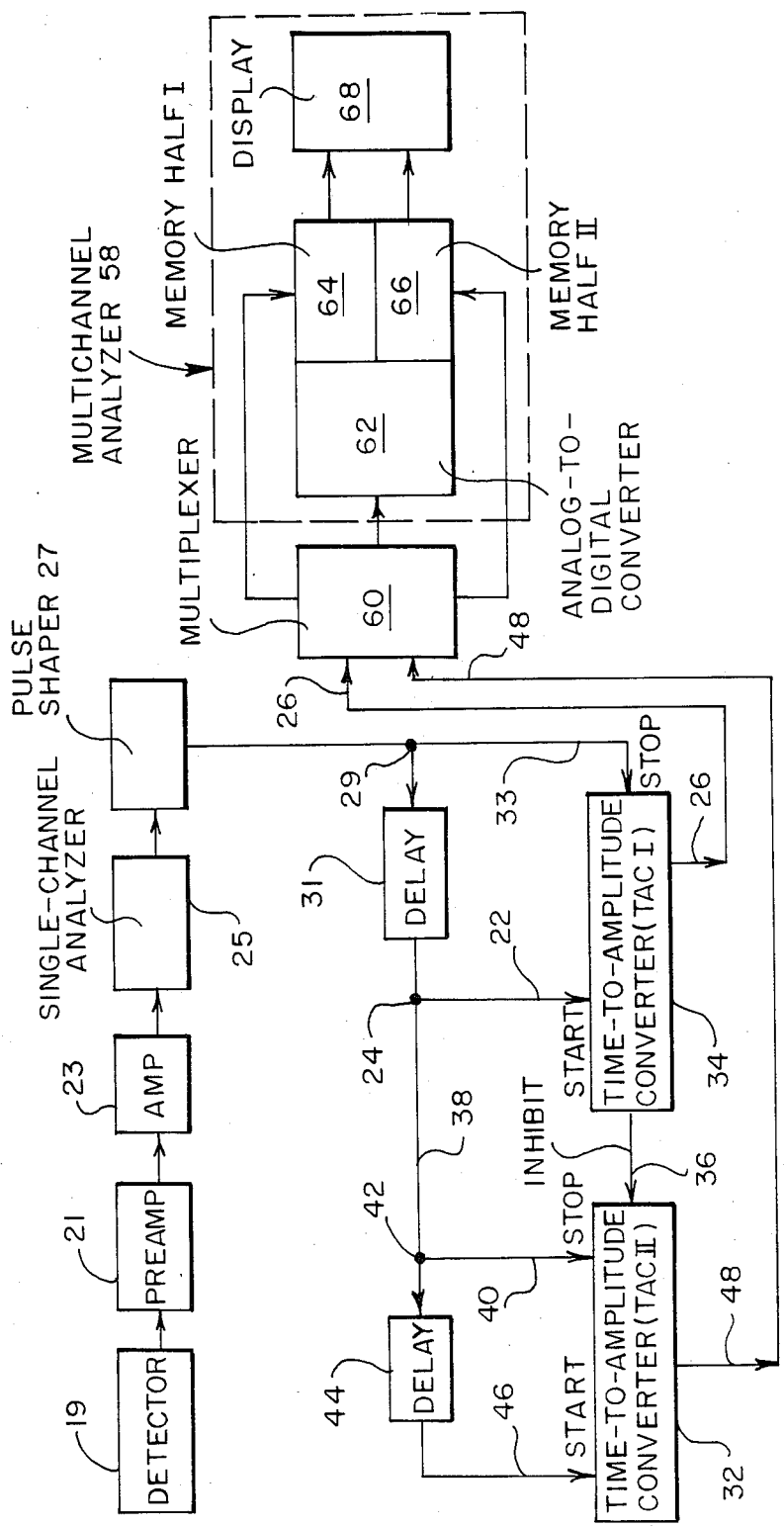
FIG. 3 is a block diagram of a system for processing detected interarrival times.

The exponential plots of FIG. 1 show the nature of the interarrival-time probability distribution of background in the absence of the signal (dashed curve) and for the signal-plus-background condition (solid curve).

In the probability plot of background, as depicted by the dashed curve, the coefficient of the exponential decay is designated as $A_B$. The exponential decay is represented by the expression $$A_B e^{-\overline{R}_B \tau}$$

where $\overline{R}_B$, the exponential decay constant, is the background mean count rate, and $\tau$ is the interarrival time. The assumption is made that all events do, in fact, occur randomly, and that the background mean count rate $\overline{R}_B$ does not fluctuate as time elapses.

The solid curve shows the exponential decay function of the same class as above, but with a different coefficient, due to the fact that this plot represents an interarrival-time probability distribution for signal combined with background. Instead of the coefficient $A_B$ of the background curve, the coefficient of the signal-plus-background distribution is the greater coefficient $A_\Sigma$, and the exponential decay of this plot is expressed as $$A_\Sigma e^{-\overline{R}_\Sigma \tau}$$

where $\overline{R}_\Sigma$ is the signal-plus-background mean count rate.

As will be observed from FIG. 1, the solid and dashed curves have a common intersection at $\tau_{int}$.

To achieve S/B improvement, the present method ignores all events for which $\tau$ is greater than $\tau_{int}$, due to the fact that for $\tau > \tau_{int}$ the background contribution exceeds the contribution from signal and background combined. Alternatively stated, in the region of $\tau$ greater than $\tau_{int}$, the contribution to net signal alone is negative. The reader, to appreciate this, is referred to FIG. 2A, which illustrates a train of randomly arriving background pulses. By way of example, two relatively long interarrival times 10 and 16 are cited. In FIG. 2B the same signal as that shown in FIG. 2A is shown, but with the interjection of signal pulses (dashed lines). The reader will observe that the interjection of these signal pulses transforms the two long background interarrival times 10 and 16 into four short intervals 12, 14 and 18, 20, respectively. Thus, occasional relatively long background interarrival times may be converted to shorter interarrival times upon the interjection of signal pulses; and, with the interjection of the signal pulses, regions that would otherwise contain long interarrival times are depleted, and regions containing short interarrival times are enriched. This result urges the ignoring of all events which have relatively long interarrival times. By excluding the longer interarrival times, an improved S/B ratio is realize d. As a result, shorter observation (i.e., data-acquisition) time, suffices.

$\tau_{co}$ is the upper limit of range of acceptable interarrival times, beyond which the interarrival time is ignored. $\tau_{co}$ may be selected to be $\tau_{int}$, the intersection between the background, and background and signal plots illustrated in FIG. 1. However, further theoretical analysis, described below, shows that another selection of $\tau_{co}$ offers even greater rewards than $\tau_{int}$.

Considering the exponential property of the probability curves, the analytical expression for statistical error shall now be considered:

$$\epsilon = \frac{\sqrt{\Sigma + B}}{\Sigma - B} \qquad \text{Eq. 1}$$

The ratio of men rates is expressed as follows:

$$g = \frac{R_\Sigma}{R_B} \qquad \text{Eq. 2}$$

and the observation duration for the background-only data and background-plus-signal data will respectively be defined at $T_B$ and $T_{93}$, and assuming these observation intervals are equal, they may be expressed as:

$$T_\Sigma = T_B = \frac{T}{2} \qquad \text{Eq. 3}$$

The elaborated expression for statistical error can then be expressed as:

$$\epsilon(g,\tau_{co}) = \sqrt{\frac{2}{R_B T}} \cdot \qquad \text{Eq. 4}$$

$$\frac{\sqrt{g(1 - e^{-gR_B\tau_{co}}) + (1 - e^{-R_B\tau_{co}})}}{g(1 - e^{-gR_B\tau_{co}}) - (1 - e^{-R_B\tau_{co}})} = \epsilon_{new}$$

Conventionally, that is, when no interarrival-time cutoff is imposed, $\tau_{co} \to \infty$, and $$\epsilon(g,\infty) = \sqrt{\frac{2}{R_B T}} \cdot \frac{\sqrt{g+1}}{g-1} = \epsilon_{old} \qquad \text{Eq. 5}$$

To each g there corresponds an optimum $\tau_{co}$ ($\equiv \tau^{opt}_{co}$). To calculate $\tau^{opt}_{co}$, minimize $\epsilon(g, \tau_{co})$ with respect to $\tau_{co}$, that is, $$\frac{\partial \epsilon(g,\tau_{co})}{\partial \tau_{co}} = 0 \qquad \text{Eq. 6}$$

For a vanishingly small signal-to-background ratio, i.e., for $g \approx 1$, $$\tau^{opt}_{co}(g \approx 1) = \frac{1.2488}{R_B} \qquad \text{Eq. 7}$$

For $g=1$, $\tau^{opt}_{co}$ will be somewhat less than $\tau_{int}$.

The improvement, I, with respect to prior-art methods:

$$I = \frac{\epsilon_{new} - \epsilon_{old}}{\epsilon_{old}} = \frac{\epsilon_{new}}{\epsilon_{old}} - 1 \qquad \text{Eq. 8}$$

For $\tau^{opt}_{co}$ and $g \approx 1$, $$\frac{\epsilon_{new}}{\epsilon_{old}} = 0.79, \qquad \text{Eq. 9}$$

and $$I(\tau_{co} = \tau^{opt}_{co}, g \approx 1) = 0.79 - 1 = -21\% \qquad \text{Eq. 10}$$

Thus, as will be appreciated, for an extremely small signal-to-background ratio, where signal data are barely perceptible, by rejecting data corresponding to interarrival times exceeding the optimum cutoff interarrival time, statistical error may be improved by 21 percent, as stated in Equation 10 hereinabove.

It has been demonstrated experimentally and theoretically that, even though the cutoff interarrival time is less than the computed optimum, it is still possible to achieve some improvement over the prior art approaches, within a wide range of $\tau_{co}$.

FIG. 3 illustrates a block diagram for improved instrumentation utilizing the method of the present invention. A suitable detector 19 senses the low-intensity random pulses. As but one example, in the event the present invention is to be applied in airborne uranium prospecting, such a detector would comprise an alkalihalide scintillator crystal optically coupled to photomultiplier tubes for converting light energy to electrons. Such a detector is manufactured by the Harshaw Filtrol Partnership, Cleveland, Ohio. The detector output is connected to a conventional preamplifier 21 and amplifier 23 for boosting the amplitudes of the signals for processing by a serially-connected single-channel analyzer 25 which discriminates against pulses having unacceptable amplitudes. The output of the single-channel analyzer 25 corresponds to signals that fall within a predetermined pulse-height "window". That output is processed by a pulse shaper 27 for presentation to subsequent circuitry. At junction 29 the pulse-shaper output is split into branches. The branch to the left conducts the shaped pulse to pulse delay 31. The output from the delay 31 is split at junction 24 into two branches. The vertical branch conducts the pulse to input terminal 22 indicated as the "start" terminal of the time-to-amplitude converter (TAC I) 34. The vertical second branch from junction 29 conducts the undelayed shaped pulse to input 33 of converter 34, indicated as the "stop" terminal. (A typical manufacturer of preamplifier 21, amplifier 23, single-channel analyzer 25, pulse shape r 27, delays 31 and 44, and time-to-amplitude converters 34 and 32 is E G & G ORTEC, Oak Ridge, Tenn.). The converter is basically a ramp-function generator. Appearing at the output terminal 26 of converter 34 are signals in the shape of truncated ramps, as will be presently discussed.

FIGS. 4A, 4B, and 4C respectively illustrate the pulse train for signals appearing at the TAC I "stop" input terminal 33, the TAC I "start" and TAC II "stop" input terminals 22 and 40, respectively, and the TAC I output terminal 26.

In FIG. 4B, a "start" pulse 35 occurs at terminal 22 of TAC I 34. As a result, as is shown in FIG. 4C, a linear ramp is initialized, appearing at output terminal 26. The TAC I terminal 33 receives a "stop" pulse 39 shown in FIG. 4A. As is shown in FIG. 4C, this terminates the ramp function 37, and the stretch interval 41 serves as a sampling interval for presentation to the input terminal 26 of a multichannel analyzer, and to be presently discussed. The interval indicated by reference numeral 43 is a TAC reset interval, preparing TAC I 34 for a new cycle. As will be appreciated by viewing the relationship between pulse 45 in FIG. 4B and the sampling interval 41 at FIG. 4C, it becomes apparent that TAC I 34, while busy generating an output at terminal 26, will be unresponsive to "start" pulses appearing at its input terminal 22. Accordingly, a second converter TAC II, designated by reference numeral 32, is employed. As a result, none of the "start" pulses will fail to initiate a ramp, and an accurate reckoning of events will be made by the multichannel analyzer. Of course, the use of two TACs is by way of example only. At high count rates, that is, for conditions under which the combined pulse-sampling and TAC-reset intervals are significant fractions of the mean interarrival time, additional TACs and associated delays will need to be incorporated in order to increase the efficiency of the tallying process.

A more detailed explanation is now given with continued reference to FIG. 3. TAC I 34 generates an inhibit signal along conductor 36 for a preset interval each time a ramp function is initiated in it, as indicated by the "inhib" pulses shown in FIG. 4D, which coincide with each "start" pulse such as 35, to which TAC I 34 responds. Thus, TAC II 32 does not generate a ramp when TAC I 34 is doing so. However, in the event a "start" pulse, such as pulse 45 in FIG. 4B, goes undetected by TAC I 34, this pulse propagates along conductor 38 to junction 42, and from there to the start terminal 46 of TAC II 32, after being conducted through delay 44. This delayed "start" pulse at terminal 46 is designated by reference numeral 50 in FIG. 4D, and, as will be seen, this "start" pulse 50 initiates a ramp function 52 at the output of TAC II 32, as shown in FIG. 4E. The succeeding pulse at junction 42 is conducted to the "stop" terminal 40, thus generating the sampling interval 54 and reset interval 56 (FIG. 4E), in direct analogy to the case in connection with FIG. 4C. The output of TAC II 32, as shown in FIG. 4E, appears at output terminal 48, and is assigned a location in that memory group of the multichannel analyzer 58 that is dedicated to the output of TAC II 32. The output of TAC I 34 is presented to the multichannel-analyzer memory group dedicated to the output of TAC I 34.

The multichannel-analyzer (MCA) 58 incorporates an analog-to-digital converter 62 that, with the intervention of a high-frequency oscillator, or "clock", transforms each sampled TAC output signal into a digital quantity that is directly proportional to the amplitude of the sampled signal, and that information is assigned a location or "address" in memory half 64 or 66 of the MCA 58. The multiplexer 60 effectuates the routing of the information into that half of the MCA that corresponds to the TAC (I or II) that generated the subject signal.

The multichannel analyzer 58 may be of the type manufactured by TRACOR NORTHERN, Middleton, Wis. Each time the multichannel analyzer 58 detects the occurrence of an event corresponding to a particular interarrival time, the contents of a corresponding memory location are incremented by one. Thus, the memory contents, as presented on a display 68, after a sufficient observation period, constitute population distributions of interarrival-time events corresponding to the exponential curves of FIG. 1. As previously explained, the utility of the system is enhanced by storing only those interarrival times $\tau_{co}$ less than a predetermined optimum value.

It should be understood that the invention is not limited to the exact details of construction shown and described herein, for obvious modifications will occur to persons skilled in the art.

I claim:

1. A method of measuring interarrival times between successive pulses of a random signal, the method comprising the steps:
   detecting the occurrence of the pulses;
   measuring the interarrival times between the pulses; and
   disregarding those interarrival times exceeding a cutoff value determined from mean count rates of
   (a) background only, and
   (b) signal-plus-background.

2. The method set forth in claim 1, wherein the exponential decay curves may be expressed as:

$$A_B e^{-\overline{R}_B \tau} \quad (a)$$

$$A_\Sigma e^{-\overline{R}_\Sigma \tau} \quad (b)$$

wherein $A_B$ and $A_\Sigma$ are coefficients, and
   $\overline{R}_B$ and $\overline{R}_\Sigma$ are mean rates of interarrival times of conditions (a) ad (b) defined in claim 1, and, further, wherein $\tau$ is the variable interarrival time.

3. A method for measuring interarrival times between successive pulses of a random signal having a vanishingly small signal-to-background ratio, the method comprising the steps:
   detecting the occurrence of the pulses;
   measuring the interarrival times between the pulses; and
   disregarding those interarrival times exceeding a cutoff value defined by the equation $$\tau_{co}^{opt}(g \simeq 1) = \frac{1.2488}{\overline{R}_B}$$

wherein $\tau^{opt}_{co}$ is the optimum cutoff value of interarrival times, and $\overline{R}_B$ is the mean rate of interarrival time of pulses for background conditions only;
and, further, wherein $$g = \frac{\overline{R}_\Sigma}{\overline{R}_B},$$

$\overline{R}_\Sigma$ being the mean rate of interarrival time of pulses for signal-plus-background conditions.

4. A method of measuring interarrival times between successive pulses of a random signal, the method comprising the steps:
   detecting the occurrence of the pulses;
   generating a ramp function in response to each pulse, the amplitude of the ramp function corresponding to the interarrival time between each pulse and a pulse immediately subsequent thereto;
   measuring the amplitude;
   accumulating the number of occurrences of substantially identical interarrival times in a memory location having an address corresponding exclusively to those particular interarrival times; and
   analyzing the exponentially decaying population distribution of interarrival times as a function of interarrival time.

5. The method set forth in claim 4 together with the step of disregarding those interarrival times exceeding a cutoff value defined by the equation for optimum conditions involving an infinitesimal signal $$\tau_{co}^{opt}(g \simeq 1) = \frac{1.2488}{\overline{R}_B}$$

wherein $\tau^{opt}{}_{co}$ is the optimum cutoff value of interarrival times, and $\overline{R}_B$ is the mean rate of interarrival times of pulses for background conditions only; and, further, wherein $$g = \frac{\overline{R}_\Sigma}{\overline{R}_B},$$

$\overline{R}_\Sigma$ being the mean rate of interarrival times of pulses for signal-plus-background conditions.

* * * * *

UNITED STATES PATENT AND TRADEMARK OFFICE
CERTIFICATE OF CORRECTION

PATENT NO. : 4,810,959
DATED : March 7, 1989
INVENTOR(S) : Gerald M. Padawer

It is certified that error appears in the above-identified patent and that said Letters Patent is hereby corrected as shown below:

In the Abstract, line 5, change "accoumulated" to --accumulated--.

Column 3, line 1, change "realize d" to --realized--.

Column 3, line 18, change "men rates" to --mean rates--.

Column 3, line 25, change "$T_{93}$" to --$T_{\Sigma}$--.

Column 3, line 53, change "$\partial\varepsilon(\vec{g},\tau_{co})$" to --$\partial\varepsilon(g,\tau_{co})$--.

Column 4, line 51, change "shape r" to --shaper--.

Column 6, line 27, change "ad" to --and--.

Signed and Sealed this

Nineteenth Day of September, 1989

Attest:

DONALD J. QUIGG

Attesting Officer   Commissioner of Patents and Trademarks